United States Patent
Liu et al.

(10) Patent No.: US 11,532,560 B2
(45) Date of Patent: Dec. 20, 2022

(54) METHOD OF FABRICATING A TUNGSTEN PLUG IN A SEMICONDUCTOR DEVICE

(71) Applicant: Texas Instruments Incorporated, Dallas, TX (US)

(72) Inventors: Yunlong Liu, Chengdu (CN); Yufei Xiong, Chengdu (CN); Hong Yang, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 104 days.

(21) Appl. No.: 14/531,177

(22) Filed: Nov. 3, 2014

(65) Prior Publication Data
US 2016/0126193 A1   May 5, 2016

(51) Int. Cl.
| H01L 23/532 | (2006.01) |
| H01L 23/485 | (2006.01) |
| H01L 21/768 | (2006.01) |
| H01L 21/311 | (2006.01) |

(52) U.S. Cl.
CPC .. *H01L 23/53295* (2013.01); *H01L 21/76801* (2013.01); *H01L 21/76804* (2013.01); *H01L 23/485* (2013.01); *H01L 21/31111* (2013.01); *H01L 21/76877* (2013.01); *H01L 2924/0002* (2013.01)

(58) Field of Classification Search
None
See application file for complete search history.

(56) References Cited

U.S. PATENT DOCUMENTS

| 6,143,648 A * | 11/2000 | Rodriguez | H01L 21/76877 257/E21.578 |
| 6,372,638 B1 * | 4/2002 | Rodriguez | 257/E21.578 |
| 6,407,002 B1 * | 6/2002 | Lin | H01L 21/31144 257/E21.256 |
| 2002/0070457 A1 * | 6/2002 | Sun | H01L 21/76804 257/774 |
| 2009/0051039 A1 * | 2/2009 | Kuo | H01L 21/76898 257/774 |

(Continued)

FOREIGN PATENT DOCUMENTS

JP    2001203170 A  *  7/2001

OTHER PUBLICATIONS

J.M. de Larios et al. Selective Etching of Native Oxide Using Vapor HF Processing. Extended Abstracts of the 1993 International Conference on Solid State Devices and Materials, Makuhari, 1993, pp. 140-142.*

(Continued)

*Primary Examiner* — Hoang-Quan Ho
(74) *Attorney, Agent, or Firm* — Jacqueline J. Garner; Frank D. Cimino

(57) ABSTRACT

In a semiconductor process, a seamless tungsten plug is formed in an inter-layer dielectric by forming the inter-layer dielectric from multiple oxide layers having different wet etch rates, from lowest wet-etch rate for the lowest layer to highest wet-etch rate for the highest layer, forming a hole or trench in the inter-layer dielectric using a dry etch process, reconfiguring the hole or trench to have sloped side walls by performing a wet etch step, and filling the hole or trench with tungsten and etching back the tungsten to form a seamless tungsten plug.

11 Claims, 2 Drawing Sheets

(56) References Cited

U.S. PATENT DOCUMENTS

2010/0244247 A1* 9/2010 Chang ............... H01L 21/76898
  257/741
2010/0301491 A1* 12/2010 Yang ................. H01L 21/02063
  257/773

OTHER PUBLICATIONS

Bae et al. Improved etching method for microelectronic devices with supercritical carbon dioxide. Microelectronic Engineering. vol. 86 Issue 2. Feb. 2009. pp. 128-131.*

* cited by examiner

METHOD OF FABRICATING A TUNGSTEN PLUG IN A SEMICONDUCTOR DEVICE

FIELD OF THE INVENTION

The invention relates to the fabrication of semiconductor devices. In particular it relates to the fabrication of tungsten plugs in a semiconductor device.

BACKGROUND OF THE INVENTION

Vertical connection between silicon device area and a metal line or between metal lines in a multilevel interconnect scheme of a semiconductor device is commonly achieved using tungsten (W). A hole is etched in the inter-layer dielectric which is then filled with metal, commonly tungsten. This provides a vertical connection between metal interconnect lines, or between the silicon device area and the $1^{st}$ layer metal. The latter is also referred to as a contact (CT) W plug. In a typical prior art approach the deposition of the tungsten is followed by an etch back process in the form of a dry etch or chemical mechanical polishing (CMP) process, so that wafer surface tungsten can be removed, while tungsten in the contact is retained. In a CMP step a polishing pad rotates against the wafer surface while a slurry removes the metal overlying the wafer surface. In the prior art approach of forming a CT tungsten plug, a vertical CT profile is created. However, a tungsten seam unfortunately forms naturally during the tungsten deposition, and the etch back process enlarges or enhances the seam.

This is illustrated in the sectional view of FIG. 1, showing two prior art tungsten plugs 100 extending through an interlayer dielectric (ILD) 102 to connect to metal 1 layer 104. The seams 110 are clearly visible in the sectional view of FIG. 1.

SUMMARY OF THE INVENTION

The present invention seeks to reduce the problem of contact tungsten etch-back seam enhancement. According to the invention, there is provided a method of fabricating a tungsten plug in an inter-layer dielectric of a semiconductor device comprising, forming the inter-layer dielectric from multiple layers of dielectric material having increasing wet etch rates from the lowest to the highest dielectric material layer, etching a hole or trench, through the inter-layer dielectric, and performing a wet etch step to change the configuration of the hole or trench to one that has substantially sloped or tapered side walls. The hole or trench may initially be etched using a dry etch process to form a hole or trench with substantially vertical walls.

The inter-layer dielectric may comprise three oxide layers with ever increasing lateral wet etch rates. The first or lowest oxide layer of the inter-layer dielectric may comprise a thermal oxide layer, which may be between 100 and 700 Angstroms thick. The second oxide layer may comprise a Tetraethylorthosilicate (TEOS) oxide layer, which may be between 800 and 1600 Angstroms thick. The third oxide layer may comprise a Borophosphosilicate Glass (BPSG) layer, which may be between 2500 and 4500 Angstroms thick.

Once the hole or trench with the sloped or tapered side walls has been formed, a contact barrier may be deposited, which may be a Ti/TiN deposition. This may be deposited without an Argon pre-clean since the wet etch has a pre-cleaning effect. The hole or trench may then be filled with tungsten to define a tungsten plug. The wafer surface tungsten may be etched back to leave behind a seamless tungsten plug in the hole or trench, e.g., using chemical mechanical polishing (CMP) or a dry etch.

Further, according to the invention, there is provided a tungsten plug in a semiconductor device, comprising a vertically extending tungsten contact extending through a plurality of dielectric material layers, wherein the dielectric material layers each have a different wet etch rate. The tungsten contact is preferably configured to have substantially sloped or tapered side walls. Accordingly, the tungsten contact may be configured to fill a hole or trench with tapered side walls. The dielectric material layers may comprise different oxide layers defining an inter-layer dielectric. For instance, the first or lowest oxide layer of the inter-layer dielectric may comprise a thermal oxide layer, the second oxide layer may comprise a Tetraethylorthosilicate (TEOS) oxide layer, and the third oxide layer may comprise a Borophosphosilicate Glass (BPSG) layer.

Still further, according to the invention there is provided a tungsten plug in a semiconductor device, comprising a vertically extending tungsten contact extending between a silicon device area and a metal line, wherein the tungsten contact is configured to have substantially sloped or tapered side walls.

DETAILED DESCRIPTION OF THE INVENTION

Figure 1:
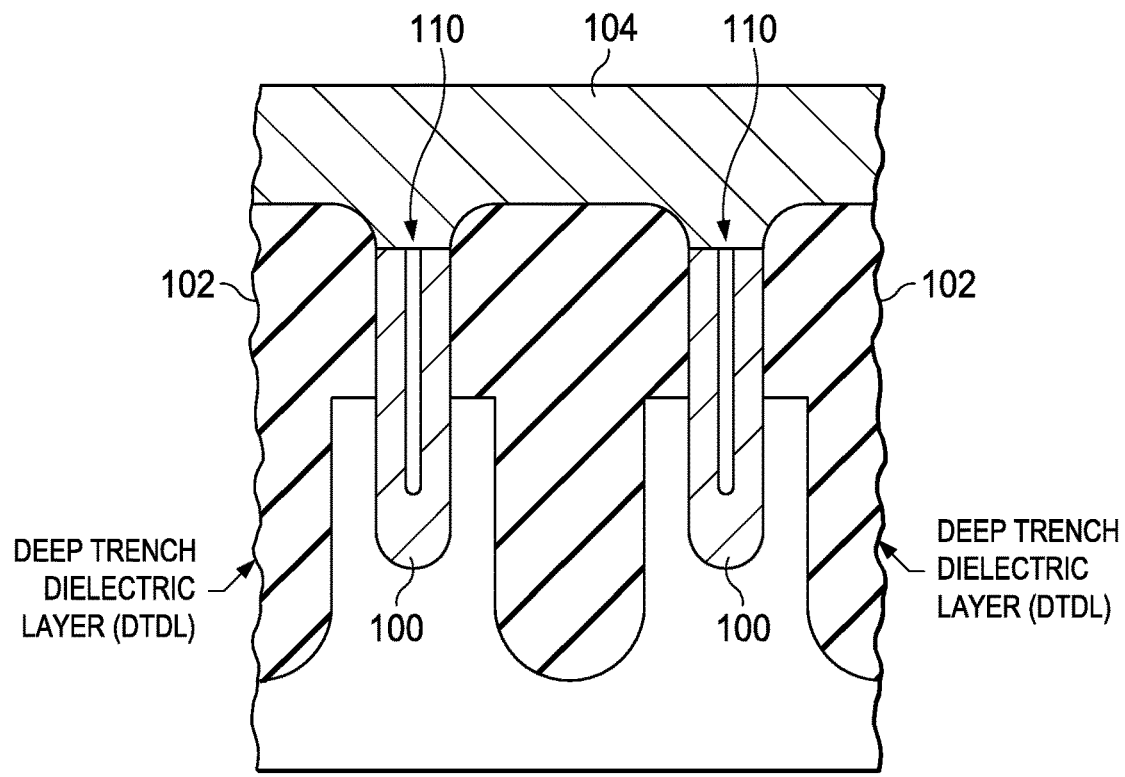
FIG. 1 is a sectional view of part of a semiconductor device showing prior art tungsten plugs.
Figure 2:
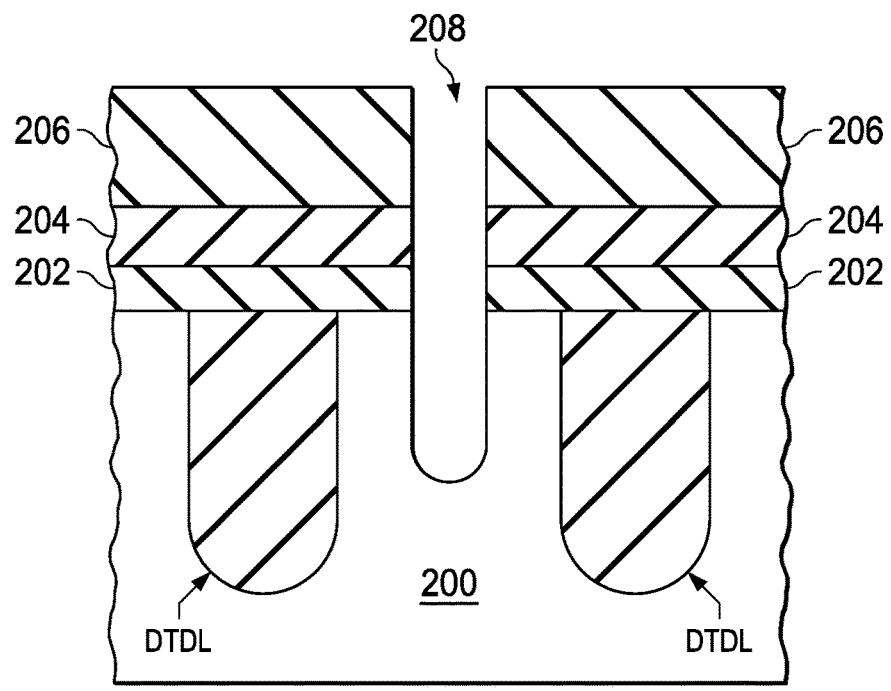
FIG. 2 is a sectional view of part of a semiconductor device showing a step in the formation of a tungsten plug involving a contact etch through an interlayer dielectric in accordance with one embodiment of the invention.
Figure 3:
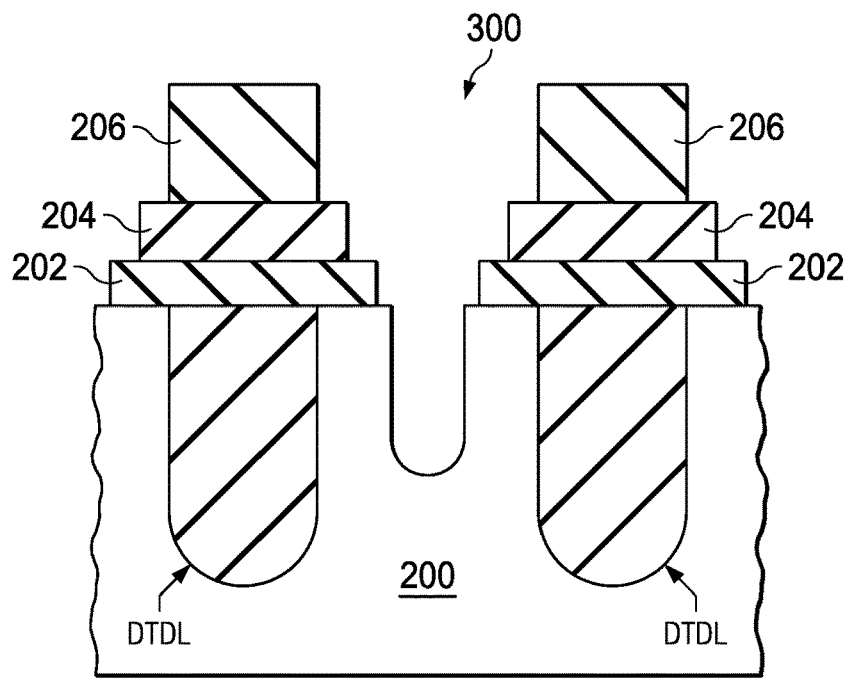
FIG. 3 is a sectional view through the device of FIG. 2 showing a further step in the formation of the tungsten plug involving a wet etch pull-back step of the interlayer dielectric in accordance with one embodiment of the invention.
Figure 4:
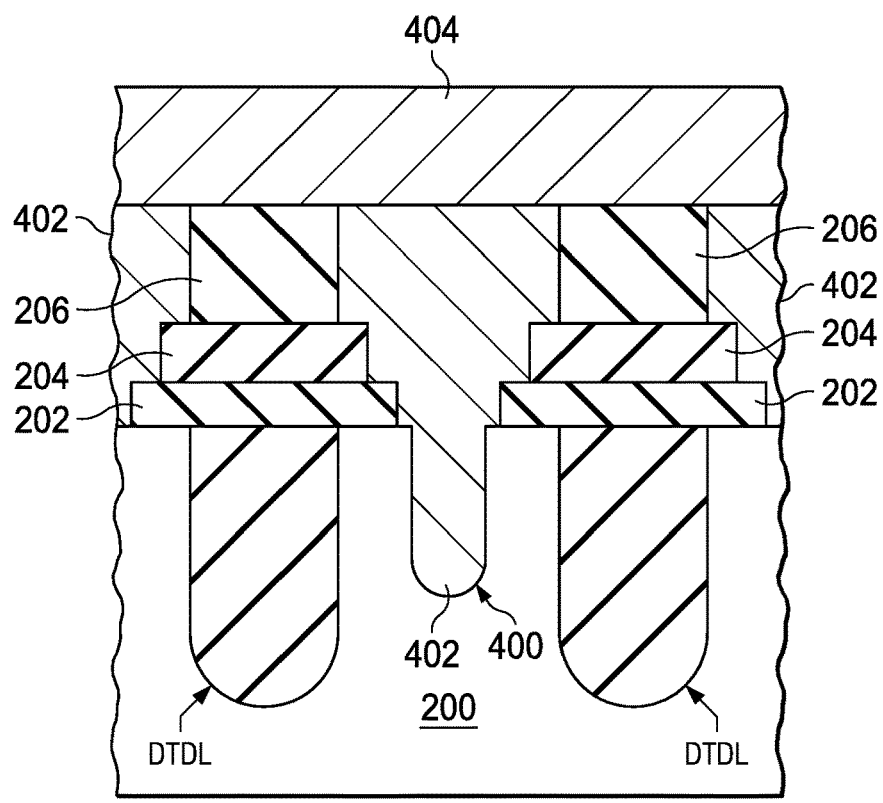
FIG. 4 shows a sectional view of tungsten plugs formed in accordance with one embodiment of the invention.

One embodiment of the present invention is shown in FIGS. 2-4. In order to address the tungsten plug seam problem, the interlayer dielectric is composed of multiple layers of dielectric material with different wet etch rates. In this embodiment three different oxide layers are formed on the silicon substrate 200. First a thermal oxide layer 202 is formed using a high temperature oxidizing agent such as water vapor or molecular oxygen to diffuse into the silicon substrate and react to form a thin SiO2 layer 202. The thermal oxide or SiO2 layer 202 may be between 100 and 700 Angstroms thick. A Tetraethylorthosilicate (TEOS) oxide layer 204 is subsequently formed by chemical vapor deposition (CVD), or can be a furnace grown TEOS, on top of the thermal oxide layer 202, followed by a Borophosphosilicate Glass (BPSG) layer 206. The TEOS layer may be between 800 and 1600 Angstroms thick, while the BPSG layer may be between 2500 and 4500 Angstroms thick.

In the present embodiment, the first SiO2 layer 202 is formed as a by-product to a gate oxide process. In order to create a vertical hole 208 or trench in the three oxide layers 202, 204, 206, a photoresist is deposited and patterned, whereafter a contact etch, which is a dry etch process, is performed to etch the oxide layers and the silicon substrate 200. The contact etch, in this embodiment, involves a two step contact etch:

Step 1: the oxide film stack is etched, stopping at the silicon 200 surface (this is processed using an oxide etcher tool)

Step 2: The silicon 200 is etched to a certain depth (Si recess) (this is processed using a Si etcher tool). The Si recess depth depends on the device requirements; in this embodiment a depth of 0.1 um~0.5 um was chosen.

This is followed by a wet etch process step, which in this embodiment is a diluted hydrofluoric acid (HF) wet etch step. Since the oxide layers making up the interlayer dielectric in this embodiment are chosen to have increasing etch rate from bottom to top, the thermal oxide 202 will be laterally etched the least while the BPSG layer 206 will be laterally etched the most to create a hole 300 with substantially sloped or tapered side walls as shown in FIG. 3.

A contact barrier layer is then deposited, which in this embodiment is a Ti/TiN layer and is deposited in this embodiment without an Argon pre-clean, since the wet etch has a pre-cleaning effect. The Ti/TiN layer is then annealed. This is designated in FIG. 4 by reference numeral 400. Thereafter the hole or trench is filled with tungsten to define a tungsten plug 402. The wafer surface tungsten is etched back to leave behind a seamless tungsten plug in the hole or trench. For ease of reference, the hole or trench for the tungsten will be referred to herein simply as a hole. It will however be appreciated that the term hole will cover a variety of shapes for the etched depressions including trenches. The etch back can be performed, for instance, using chemical mechanical polishing or a dry etch. This allows the metal 1 layer 404 to be deposited over the tungsten plug 402 to make good contact with the plug 402.

In the above embodiment, layers of thermal oxide, TEOS and BPSG were used, however, it will be appreciated that other dielectric layers could be used, having increasing etch resistance for the higher layers, without departing from the scope of the invention. For example, other oxide types, like PEOX, PSG, SOG, etc., could be used provided they are stacked with increasing wet etch rate toward the top.

What is claimed is:

1. A semiconductor device, comprising:
a substrate comprising silicon;
a first dielectric layer above the substrate;
a second dielectric layer on the first dielectric layer; and
a third dielectric layer on the second dielectric layer;
a trench extending through the third dielectric layer, the second dielectric layer, and the first dielectric layer, and partially into the silicon of the substrate, the trench having a sidewall wherein an edge of the first dielectric layer is recessed from a top edge of the silicon at the sidewall, an edge of the second dielectric layer is recessed from the edge of the first dielectric layer at the sidewall and an edge of the third dielectric layer is recessed from the edge of the second dielectric layer at the sidewall; and
a contiguous tungsten contact filling the trench.

2. The semiconductor device of claim 1, wherein the first dielectric comprises a first material, the second dielectric layer comprises a second material different than the first material, and the third dielectric layer comprises a third material different than the first and second materials.

3. The semiconductor device of claim 2, wherein the first material is thermal oxide, the second material is Tetraethylorthosilicate (TEOS) oxide, and the third material is Borophosphosilicate Glass (BPSG).

4. The semiconductor device of claim 1 further comprising a contact barrier layer lining the trench, wherein the contact barrier layer contacts the top edge of the silicon, the edge of the first dielectric layer, the edge of the second dielectric layer and the edge of the third dielectric layer.

5. The semiconductor device of claim 4, wherein the contact barrier layer comprises a bi-layer of Ti and TiN.

6. A semiconductor device, comprising:
a substrate comprising silicon;
a first dielectric layer comprising a first material having a first wet etch rate above the substrate;
a second dielectric layer comprising a second material with a second wet etch rate directly on the first dielectric layer; and
a third dielectric layer directly on the second dielectric layer, the third dielectric layer comprising a third material having a third wet etch rate, wherein the third wet etch rate is greater than the second wet etch rate which is greater than the first etch rate;
a trench extending through the third dielectric layer, the second dielectric layer, and the first dielectric layer, and partially into the silicon of the substrate, the trench having a sidewall wherein an edge of the first dielectric layer is recessed from a top edge of the silicon at the sidewall, an edge of the second dielectric layer is recessed from the edge of the first dielectric layer at the sidewall and an edge of the third dielectric layer is recessed from the edge of the second dielectric layer at the sidewall;
a contact barrier layer lining the trench; and
a contiguous tungsten contact filling the trench.

7. The semiconductor device of claim 6, wherein the contact barrier layer comprises a bi-layer of Ti and TiN.

8. The semiconductor device of claim 7, wherein the contact barrier layer contacts the top edge of the silicon, the edge of the first dielectric layer, the edge of the second dielectric layer and the edge of the third dielectric layer.

9. The semiconductor device of claim 6, further comprising a contact barrier layer lining the trench.

10. The semiconductor device of claim 9, wherein the contact barrier layer comprises a bi-layer of Ti and TiN.

11. The semiconductor device of claim 9, wherein the contact barrier layer contacts the trench sidewall at each of the at least four steps.

* * * * *